United States Patent
Giusti et al.

(10) Patent No.: US 11,242,242 B2
(45) Date of Patent: Feb. 8, 2022

(54) MICROFLUIDIC MEMS DEVICE FOR FLUID EJECTION WITH PIEZOELECTRIC ACTUATION

(71) Applicants: STMICROELECTRONICS S.R.L., Agrate Brianza (IT); STMICROELECTRONICS, INC., Coppell, TX (US)

(72) Inventors: Domenico Giusti, Caponago (IT); Simon Dodd, West Linn, OR (US)

(73) Assignees: STMICROELECTRONICS S.R.L., Agrate Brianza (IT); STMICROELECTRONICS, INC., Coppell, TX (US)

( * ) Notice: Subject to any disclaimer, the term of this patent is extended or adjusted under 35 U.S.C. 154(b) by 327 days.

(21) Appl. No.: 16/422,504

(22) Filed: May 24, 2019

(65) Prior Publication Data
US 2019/0367357 A1    Dec. 5, 2019

(30) Foreign Application Priority Data

May 29, 2018 (IT) .......................... 102018000005824

(51) Int. Cl.
*B81B 7/02* (2006.01)
*B01L 3/00* (2006.01)

(52) U.S. Cl.
CPC ............ *B81B 7/02* (2013.01); *B01L 3/50273* (2013.01); *B01L 3/502715* (2013.01); *B81B 2201/038* (2013.01); *B81B 2201/058* (2013.01)

(58) Field of Classification Search
CPC ........ B81B 2201/057; B81B 2201/052; B81B 2201/032; B81B 7/02; B01L 3/502715; B01L 3/50273; B01L 3/00
See application file for complete search history.

(56) References Cited

U.S. PATENT DOCUMENTS

| | | | |
|---|---|---|---|
| 6,079,820 A | 6/2000 | Dijksman et al. | |
| 7,559,631 B2 | 7/2009 | Shimada et al. | |
| 8,633,553 B2 | 1/2014 | Ferrera et al. | |
| 8,998,388 B2 | 4/2015 | Cattaneo et al. | |

(Continued)

FOREIGN PATENT DOCUMENTS

| | | |
|---|---|---|
| EP | 0917509 | 12/2001 |
| WO | 9818633 | 5/1998 |

OTHER PUBLICATIONS

Takahashi, "Adaptability of Piezoelectric Inkjet Head," NIP17: International Conference on Digital Printing Technologies, Sep. 30-Oct. 5, 2001, pp. 323-327.

*Primary Examiner* — Brian J. Sines
(74) *Attorney, Agent, or Firm* — Seed Intellectual Property Law Group LLP (57) ABSTRACT

A microfluidic MEMS device is formed by a plurality of ejection cells each having a fluid chamber; an actuator chamber; a membrane having a first surface facing the actuator chamber and a second surface facing the fluid chamber; a piezoelectric actuator on the first surface of the membrane; and a passivation layer on the piezoelectric actuator. The membrane has an elongated area defining a longitudinal direction and a transverse direction. The passivation layer has a plurality of holes. The holes extend throughout the thickness of the passivation layer and, in a plan view, have an elongated shape with a greater dimension parallel to the longitudinal direction of the membrane and a smaller dimension parallel to the transverse direction.

20 Claims, 10 Drawing Sheets

(56) References Cited

U.S. PATENT DOCUMENTS

| | | |
|---|---|---|
| 9,174,445 B1 | 11/2015 | Prati et al. |
| 2011/0043573 A1 | 2/2011 | Umeda |
| 2012/0229573 A1 | 9/2012 | Mizukami et al. |
| 2014/0313264 A1 | 10/2014 | Cattaneo et al. |
| 2016/0027988 A1 | 1/2016 | Nagahata |
| 2016/0072039 A1 | 3/2016 | Iida |
| 2018/0141074 A1 | 5/2018 | Giusti et al. |

MICROFLUIDIC MEMS DEVICE FOR FLUID EJECTION WITH PIEZOELECTRIC ACTUATION

BACKGROUND

Technical Field

The present disclosure relates to a microfluidic MEMS device for fluid ejection with piezoelectric actuation.

Description of the Related Art

As is known, for spraying inks, perfumes and the like, the use has been proposed of microfluidic devices of small dimensions, which may be obtained using microelectronic manufacturing techniques at low costs.

For example, U.S. Pat. No. 8,998,388 and Italian Patent Application No. 102016000118584, filed on 23 Nov. 2016 (corresponding to U.S. Patent Publication No. 2018/0141074 A) disclose microfluidic devices suitable for spraying ink, having the general structure shown in FIG. 1.

Figure 1:
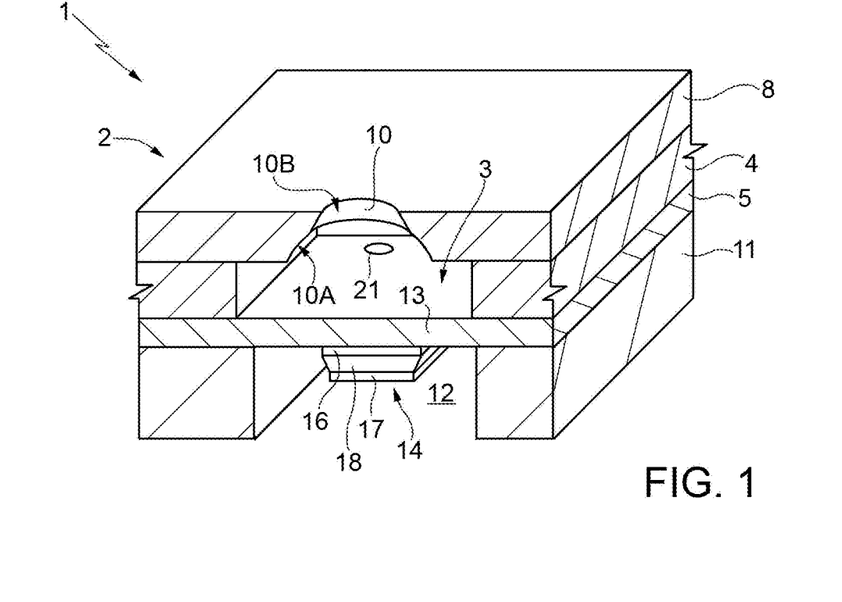
FIG. 1 shows a prospective cross-section of an ejection cell of a known microfluidic MEMS device for inkjet printing with piezoelectric actuation.

FIG. 1 shows a cell 2 of a microfluidic device 1 for spraying liquids. The cell 2 comprises a fluid chamber 3 configured to contain a fluid and formed inside a chamber layer 4. The fluid chamber 3 is delimited at the bottom by a thin layer 5 and at the top by an upper layer 8.

The upper layer 8 accommodates an outlet channel 10 having a wider portion 10A, facing the fluid chamber 3, and a narrow portion 10B, facing the opposite direction (towards the outside of the microfluidic device 1).

The thin layer 5 extends on a substrate 11 having an actuator chamber 12 that is generally vertically aligned to the outlet channel 10. The portion of the thin layer 5 overlying the actuator chamber 12 forms a membrane or diaphragm 13.

The membrane 13 carries, on its surface looking forward the actuator chamber 12, an actuator 14. The actuator 14 may be piezoelectric. In this case, it generally comprises two electrodes 16, 17, arranged on top of each other, and an intermediate piezoelectric layer 18, for example of PZT (Pb, Zr, TiO$_3$).

The fluid chamber 3 is in fluidic connection with an inlet channel (not visible) through an inlet hole 21 extending through the thin layer 5 and enabling inlet and transport of a liquid inside the fluid chamber 3.

The microfluidic device 1 generally comprises a plurality of cells 2 connected, through the inlet hole 21, to a liquid-supply system (not shown).

Figure 2:
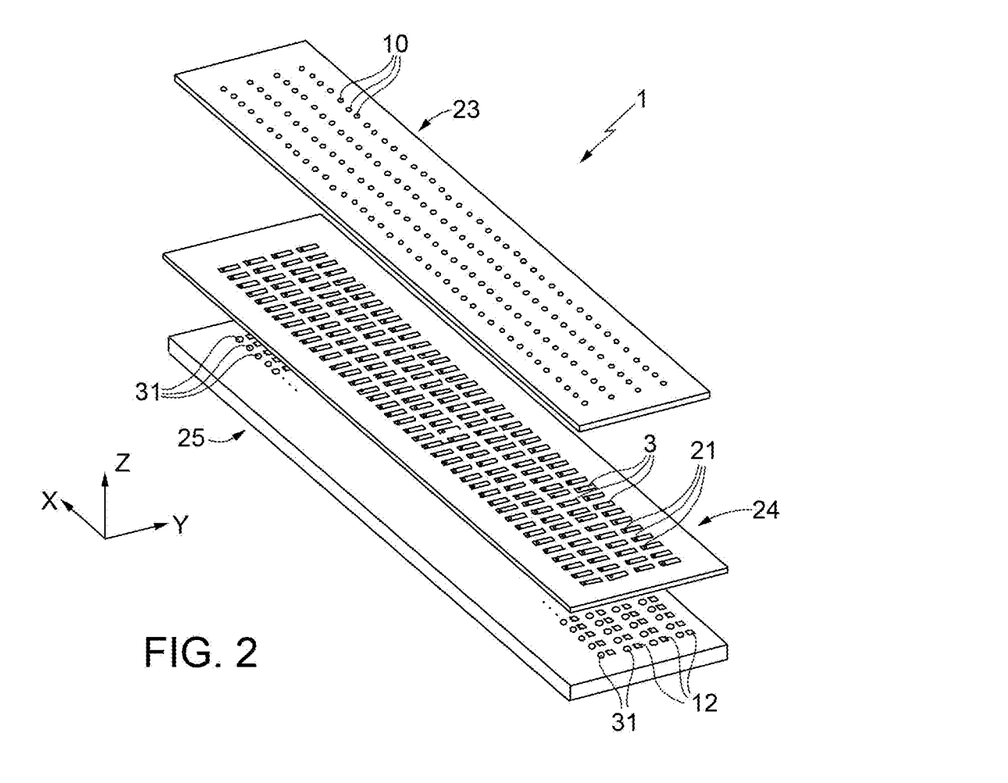
FIG. 2 is a prospective, exploded view of a MEMS printhead comprising a plurality of ejection cells of FIG. 1.

The microfluidic device 1 may be obtained by bonding three portions: a nozzle plate 23, a membrane plate 24 and a distribution plate 25, as shown in FIG. 2.

All the plates 23-25 may be obtained using microfabrication techniques starting from semiconductor wafers. As shown in FIG. 2, the nozzle plate 23 comprises a plurality of nozzles 10 such as the nozzle 10 of FIG. 1; the membrane plate 24 corresponds to the chamber layer 4 and the thin layer 5 of FIG. 1, comprises a plurality of fluid chambers 3 such as the fluid chamber 3 of FIG. 1 and forms a plurality of membranes (not visible in FIG. 2) such as the membrane 13 of FIG. 1; and the distribution plate 25 corresponds to the substrate 11 of FIG. 1 and forms a plurality of actuator chambers 12 and inlet channels 31, such as the corresponding elements of FIG. 1.

Figure 3:
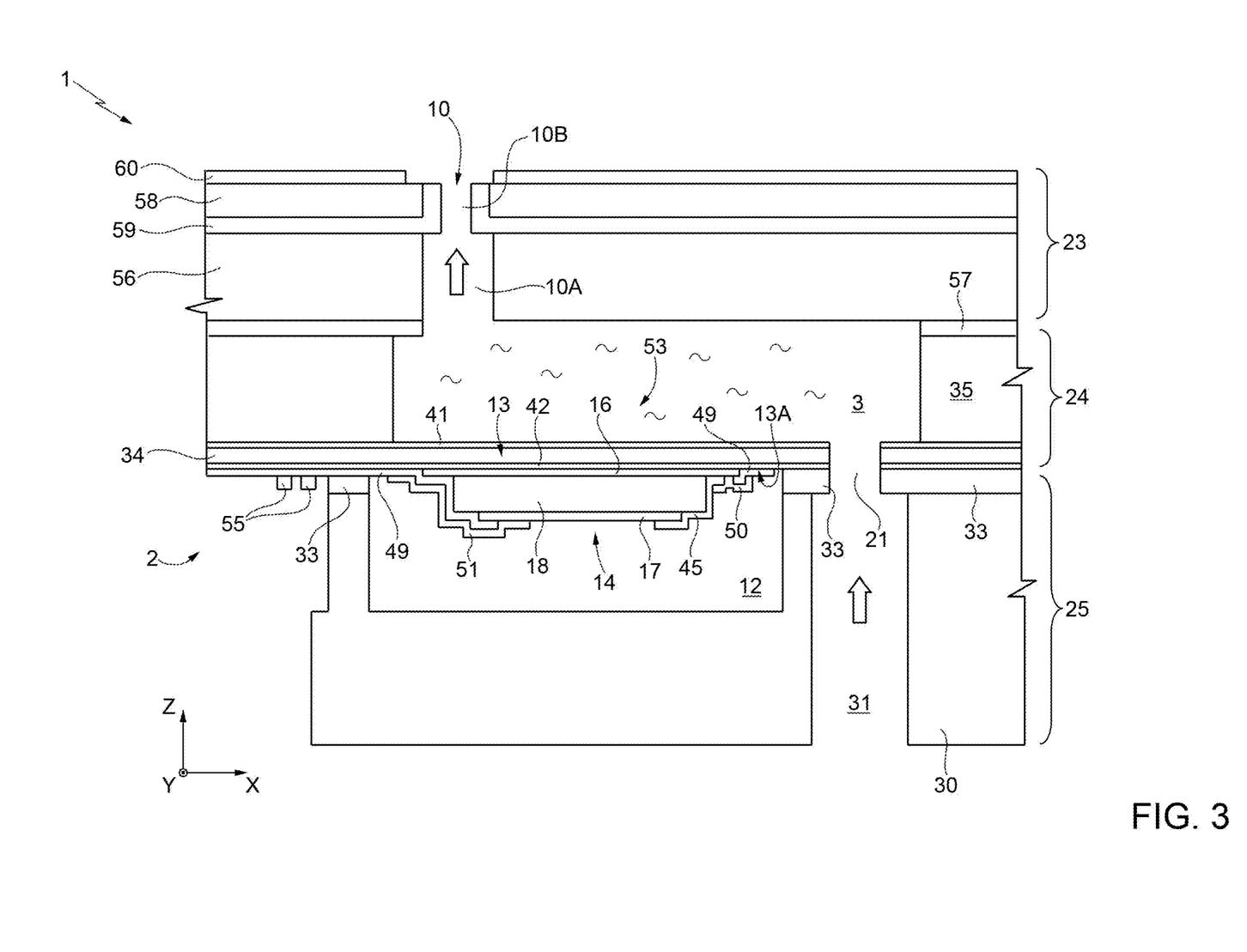
FIG. 3 is a detailed, enlarged longitudinal cross-section of the known ejection cell of FIG. 1.

FIG. 3 shows a cross-section of a detailed embodiment of a cell 2 of the microfluidic device 1, taken along a perpendicular plane to that of FIG. 1.

In detail, the distribution plate 25 is formed by a main body 30, for example of monocrystalline silicon; the inlet channel 31 extends through the body 30 and communicates with an external reservoir (not shown). The main body 30 forms the actuator chamber 12, arranged laterally to the inlet channel 31 and isolated with respect to the latter.

The membrane plate 24 is superposed and bonded to the main body 30 through a first bonding layer 33. The membrane plate 24 comprises a membrane layer 34 (forming the membrane 13) and a chamber body 35 (defining the fluid chamber 3), mutually superposed; for example, the membrane layer 34 is of polycrystalline silicon and the chamber body 35 is of monocrystalline silicon.

The membrane layer 34 is covered by insulating layers 41, 42, of insulating material such as TEOS (Tetra-Ortho Silicate), and is bonded to the main body 30 through the first bonding layer 33 and closes the actuator chamber 12 at the top.

The membrane layer 34, the first bonding layer 33 and the insulating layers 41, 42 have respective mutually aligned openings forming the inlet hole 21 in fluid connection with the inlet channel 31.

The membrane 13 carries, on its side 13A opposite the fluid chamber 3 and facing the main body 30, a piezoelectric actuator 14 arranged inside the actuator chamber 12. The piezoelectric actuator 14 also includes the first electrode 16, of electrically-conductive material, for example of titanium or platinum; the piezoelectric layer 18, for example PZT (Pb, Zr, TiO$_3$); the second electrode 17, for example of TiW (alloy of titanium and tungsten); as well as a dielectric layer 49, for example of silicon oxide and silicon nitride deposited by CVD (Chemical Vapor Deposition). In particular, the dielectric layer 49 extends on the sides of the piezoelectric layer 18 and electrically isolates it from contact tracks 50, 51, in electrical contact respectively with the first electrode 16 and the second electrode 17.

The membrane 13 and the piezoelectric actuator 14 form an actuation portion 53 of the cell 2.

The membrane layer 34 furthermore carries, on its side facing the main body 30, a pair of contacts 55, of conductive material, arranged laterally to and outside the actuator chamber 12, for external connection.

The nozzle plate 23 comprises an outlet channel layer 56, of semiconductor material, bonded to the chamber body 35 through a second bonding layer 57; a nozzle layer 58, of semiconductor material, bonded to the outlet channel layer 56 through an insulating layer 59, for example of thermal oxide; and an anti-wettability layer 60, extending on top of the nozzle layer 58. The outlet channel 10 extends through layers 56-60 and is in fluidic communication with the fluid chamber 3. In particular, the wider portion 10A of the outlet channel 10 extends through the outlet channel layer 56 and the narrow portion 10B of the outlet channel 10 extends through the nozzle layer 58 and forms a nozzle.

The nozzle plate 23, the membrane plate 24 and the distribution plate 25 are processed separately and assembled subsequently.

In use, the piezoelectric actuator 14 first may be controlled to cause the membrane 13 to deflect downwards, so as to increase the volume of the fluid chamber 3 and cause the inlet of a precise quantity of fluid from the inlet channel 31; then the piezoelectric actuator 14 may be controlled to cause the membrane 13 to deflect upwards, and cause a controlled ejection of a drop of liquid through the outlet channel 10. In many applications, for example when the microfluidic device 1 is a printhead used in color inkjet printers, it is desired to have a good control of the drop ejected from the nozzle 10B. This may be achieved when the membrane 13 deforms in a stable and controlled way.

However, current microfluidic devices of the type described above are not able to ensure the desired deformation behavior.

Figure 4:
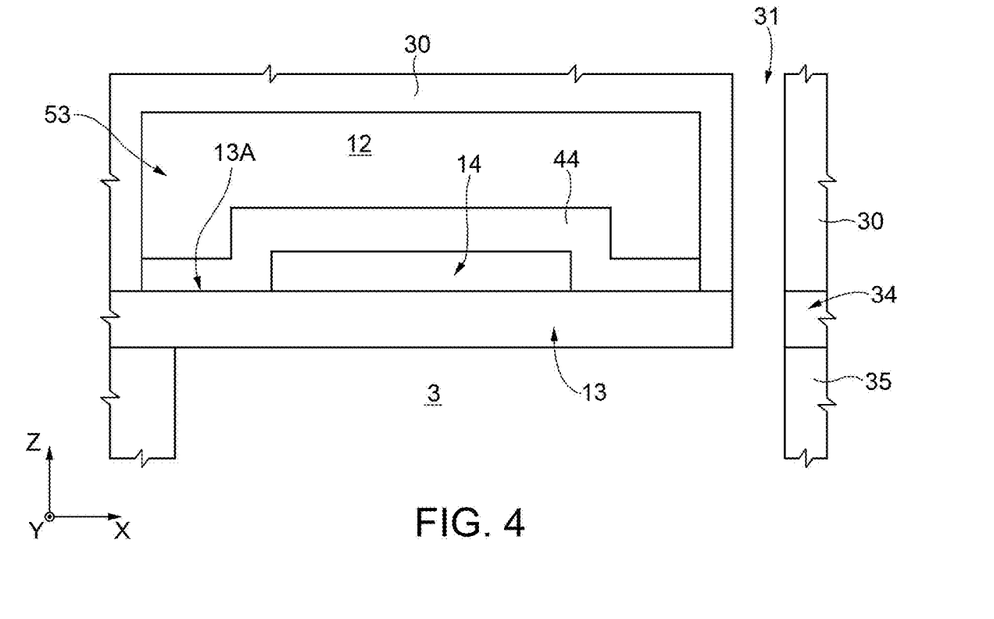
FIG. 4 is a schematic transverse cross-section of the ejection cell of FIG. 3.

For a better comprehension of this problem, reference is made to FIGS. 4-9 showing the structure and deformation of the membrane 13. In particular, FIG. 4 shows, turned upside down, a simplified cross-section of the actuation portion 53 of the cell 2 of FIG. 3 taken in a plane parallel to plane YZ of a Cartesian reference system XYZ. In detail, FIG. 4 shows the chamber body 35, the membrane layer 34, the piezoelectric actuator 14 (schematically represented as a rectangle) and a passivation layer 44 covering the piezoelectric actuator 14 and the surface of the membrane layer 34 facing the actuator chamber 12. The passivation layer 44 is of a material able to protect the piezoelectric actuator 14, in particular the piezoelectric layer 18 (not visible in FIG. 4), from any liquid seeping in the actuator chamber 12, and not to negatively affect the deformation of the membrane 13 during actuation.

The passivation layer 44 may be an inorganic insulating material, such as silicon nitride, aluminum oxide or tantalum oxide, that has low water permeability and good Young's modulus of elasticity. The passivation layer 44 may have a thickness of between 0.2-1.0 µm.

Figure 5:
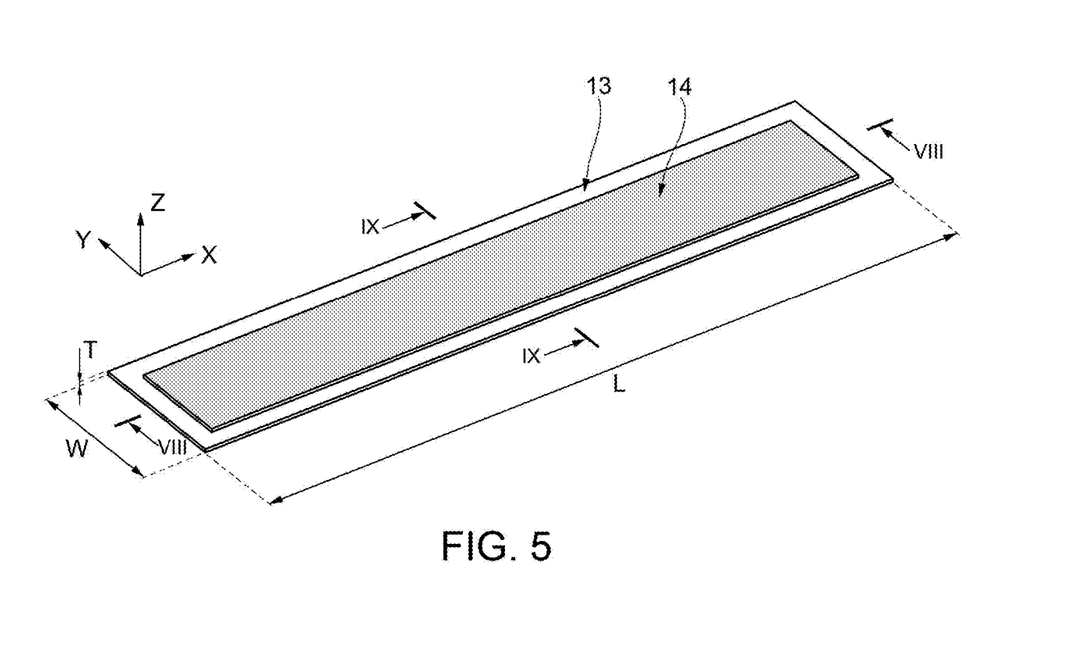
FIG. 5 is a perspective view from above of a membrane portion of the ejection cell of FIGS. 3-4.

As may be seen in the perspective view of FIG. 5, the membrane 13 has a rectangular area with a length L (in a direction parallel to a first axis X of the Cartesian reference system XYZ) that is much longer than its width W (in a direction parallel to a second axis Y of the Cartesian reference system XYZ). The membrane 13 has also a small thickness T (taken along a third axis Z of the Cartesian reference system XYZ. For example, in microfluidic devices for inkjet printers of the considered type, L may be about 70-1500 µm, W may be 50-200 µm and T may be 0.5-10 µm.

Due to this high aspect ratio of the rectangular area, as well as due to the presence of the piezoelectric actuator 14 on most of the membrane area, the membrane 13 is subject to a bulge effect, whereby, when the membrane 13 is actuated, its bottom surface is not approximatively linear along its length direction (parallel to first axis X) as desired.

This behavior is shown in simulations made by the Applicant and shown in FIGS. 6-9. In detail, FIGS. 6-9 show the deformation of the membrane 13 when an actuation voltage of 40 V is applied between the electrodes 16, 17 (FIG. 3).

Figure 6:
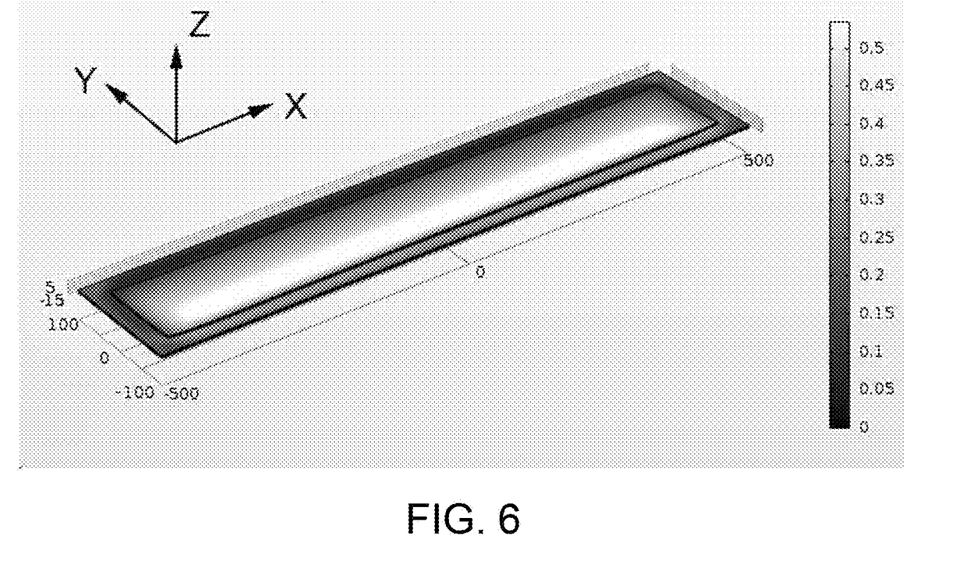
FIG. 6 shows, in grey scale and perspective, the displacement of the membrane portion of FIG. 5 in a uniform scale.
Figure 7:
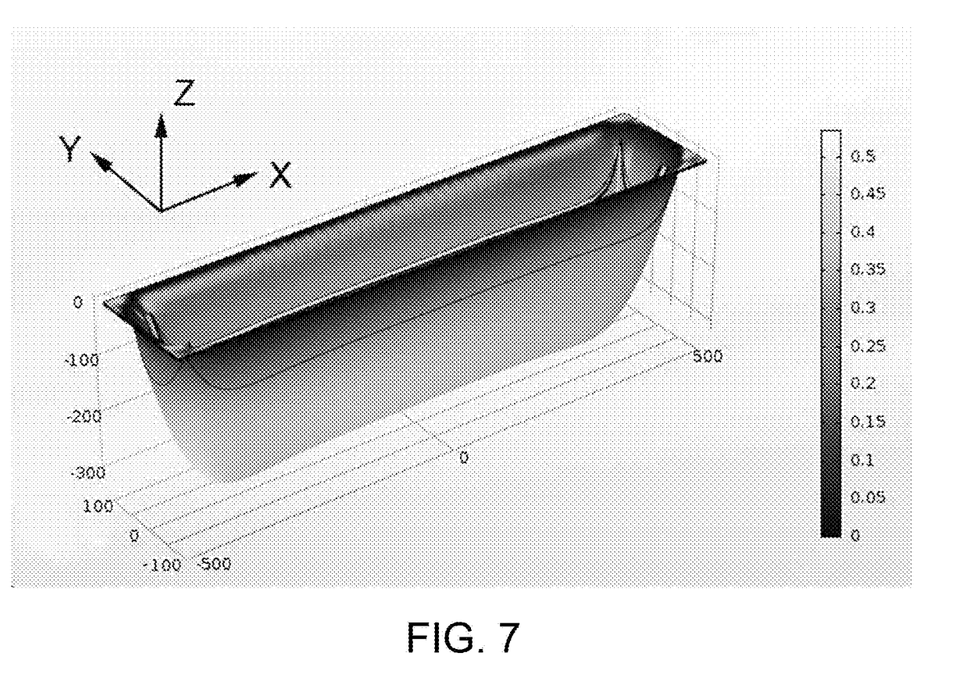
FIG. 7 shows, in grey scale and perspective, the displacement of the membrane portion of FIG. 5 in a vertically amplified scale.

In particular, FIG. 6 shows, in a grey scale and perspective, the displacement of the membrane 13 in an enlarged, uniform scale and FIG. 7 shows, also in a grey scale and perspective, the same displacement using an amplified scale along third axis Z to more clearly show the deformation.

Figure 8:
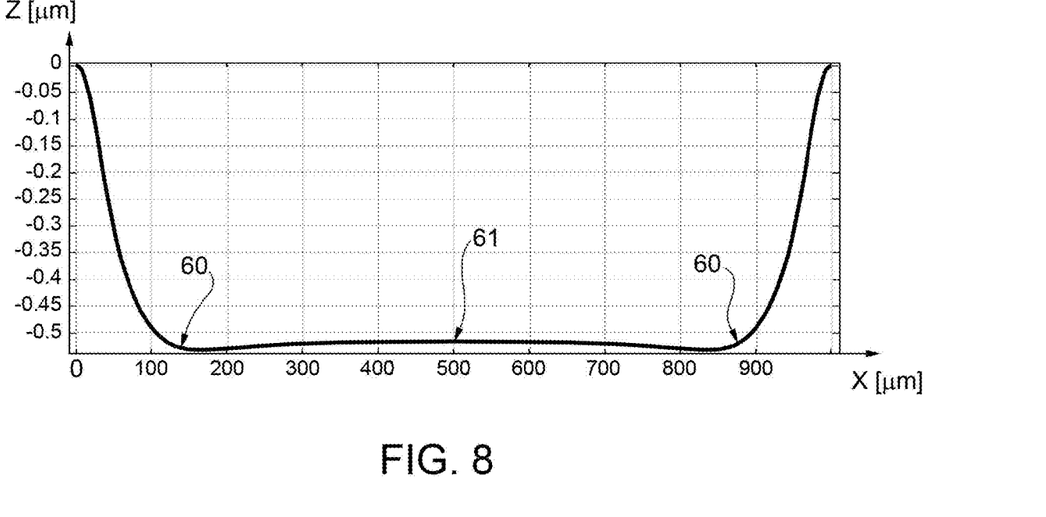
FIGS. 8 and 9 show plots of the displacement of the membrane portion of FIG. 5 in cross-sections taken along planes VIII-VIII and IX-IX, respectively.
Figure 9:
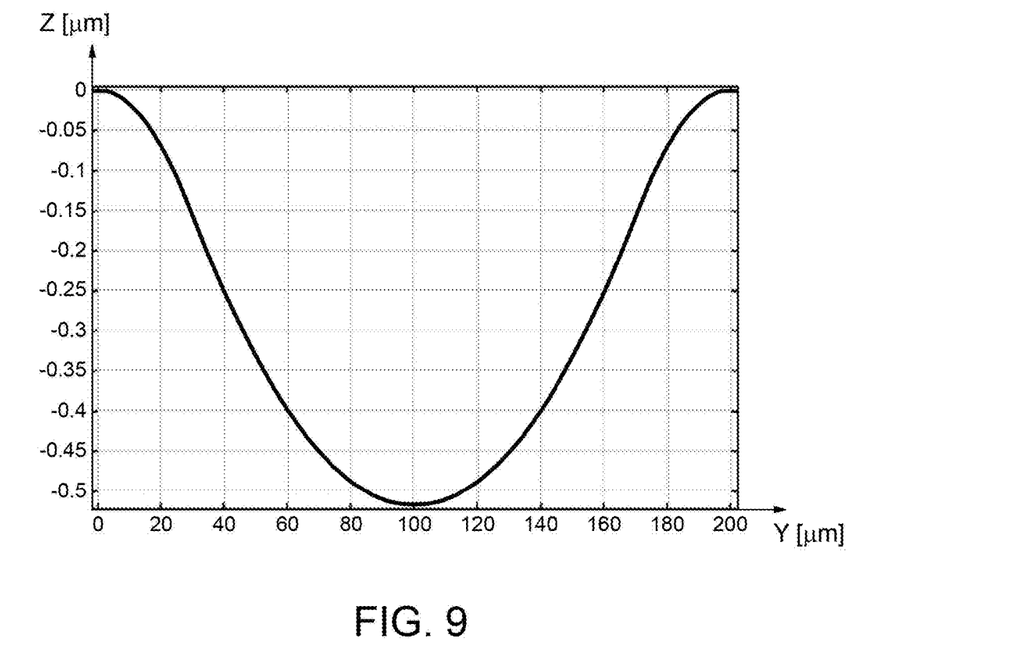

FIGS. 8 and 9 show the plots of the displacement of the membrane 13 (considered as bidimensional, in view of the reduced thickness thereof) along a longitudinal and, respectively, transverse central direction thereof.

As may be seen, the membrane 13, when actuated, deforms uniformly in the transverse direction (parallel to the second axis Y, FIG. 9) by virtue of the small width thereof, but has bulged end portions 60 and a recessed central portion 61 in the longitudinal direction, parallel to the first axis X (as clearly visible in FIGS. 7 and 8).

This is however disadvantageous since it adds a small amount of overpressure during drop ejection.

BRIEF SUMMARY

One or more embodiments are directed to a MEMS microfluidic device that deforms, when actuated, in a more uniform way in both the longitudinal and transverse directions. At least one embodiment is directed to a microfluidic MEMS device for fluid ejection with a piezoelectric actuation that has a reduced bulge effect.

BRIEF DESCRIPTION OF THE SEVERAL VIEWS OF THE DRAWINGS

For the understanding of the present disclosure, embodiments are now described, purely as a non-limitative example, with reference to the attached drawings, wherein.

DETAILED DESCRIPTION

Figure 10:
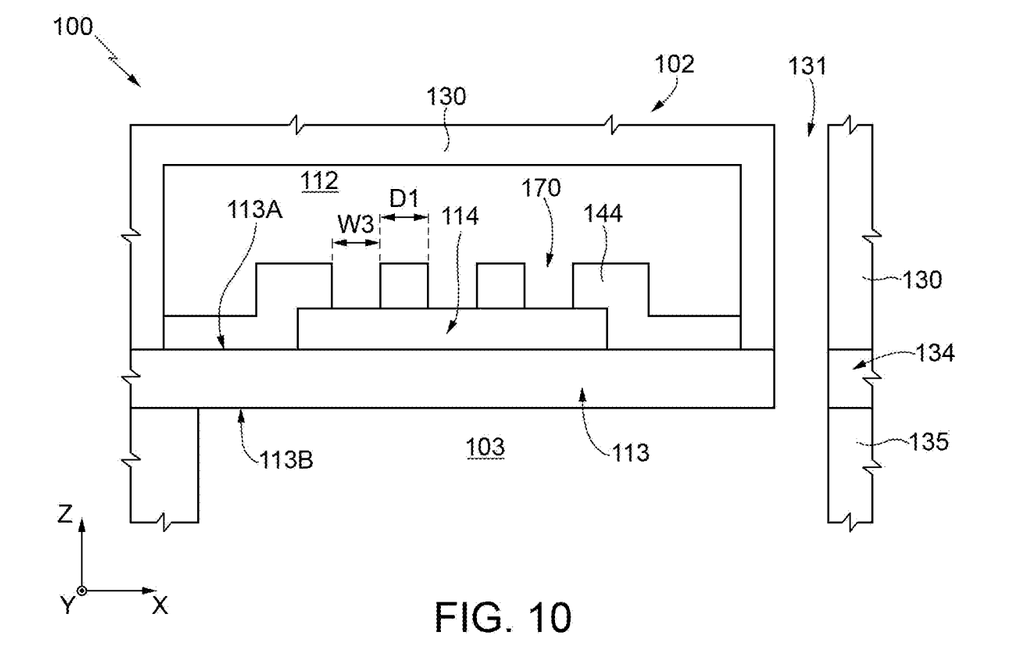
FIG. 10 is a schematic transverse cross-section of an ejection cell of the instant microfluidic MEMS device.

FIG. 10 shows an ejection cell 102 of a MEMS device 101 having a general structure as shown in FIGS. 2 and 3; thus parts similar to the ejection cell 2 of FIG. 3 have been indicated by reference numbers increased by 100.

In detail, the ejection cell 102 comprises a membrane 113 formed in a membrane layer 134 similar to membrane layer 34 of FIG. 3, and thus extending between an actuator chamber 112 and a fluid chamber 103 and having a first surface 113A facing the actuator chamber 112 and a second surface 113B facing the fluid chamber 103. The membrane 113 has an elongated shape with a rectangular area in a plane parallel to a plane XY of a Cartesian reference system XYZ.

The membrane 113 carries, on a surface 113A thereof facing the actuator chamber 112, a piezoelectric actuator 114 (schematically represented as a rectangle and implemented, e.g., as the piezoelectric actuator 14 of FIG. 3; thus the piezoelectric actuator 114 includes a piezoelectric layer sandwiched between two electrodes, not shown).

A passivation layer 144 extends on the piezoelectric actuator 114 and the surface 113A of the membrane 113 facing the actuator chamber 112. The passivation layer 144 is, e.g., of silicon nitride, deposed by CVD (Chemical Vapor Deposition) and have, e.g., a thickness of 0.2-1.5 µm. Since silicon nitride has a high Young's modulus, this ensures a good rigidity to the membrane 113 in a longitudinal direction, that is parallel to the first axis X of the Cartesian reference system XYZ.

Figure 11:
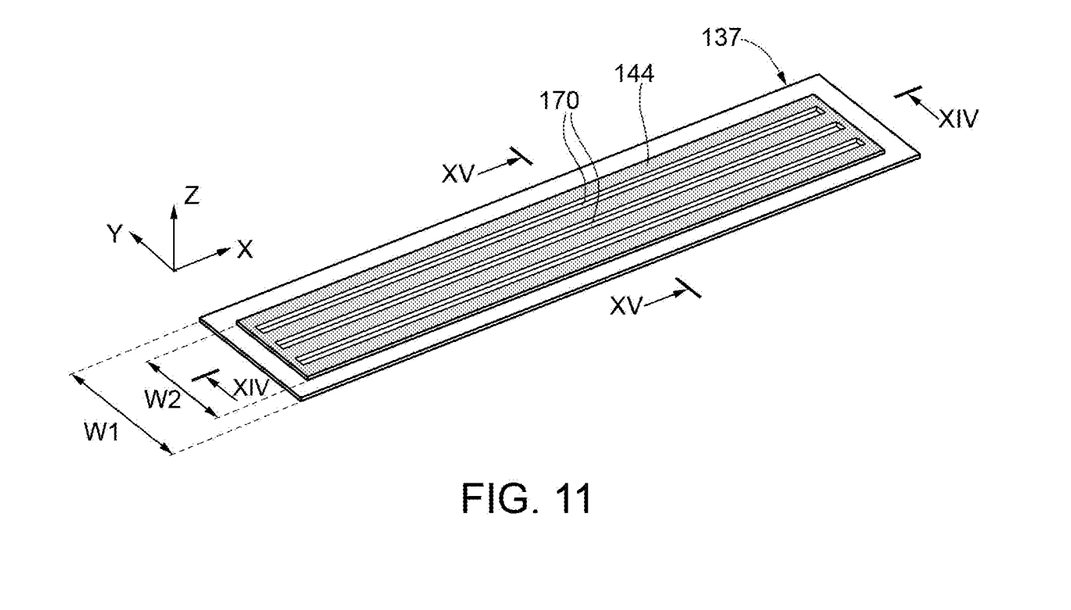
FIG. 11 is a perspective view from above of a membrane portion of the ejection cell of FIG. 10.

The passivation layer 144, as also visible in FIG. 11, has a plurality of holes 170, herein the form of slits, having an elongated shape. In the embodiment of FIGS. 10-11, the holes 170 have, in a plan view, a rectangular shape with their long side extending longitudinally to the membrane 113, parallel to first axis X.

For example, the holes 170 extend for the entire thickness of the passivation layer 144 and for all or most of the length thereof (e.g., at least the 80-95% thereof. The holes 170 may be arranged adjacent to each other, at a uniform distance. For example, in case of a membrane 113 having a width W1 of 250 µm and a passivation layer 144 having a width W2 of 200 µm, the holes 170 may have a width W3 of 25-30 µm and be arranged at a distance D1 of 10-20 µm, also representing the width of the portions of the passivation layer 144 between two adjacent holes 170.

By virtue of the holes 170, the passivation layer 144 does not affect the elasticity of the membrane 113 in the width direction (parallel to second axis Y) but slightly stiffens the membrane 113 in the longitudinal direction (parallel to first axis X) such as not to prevent or reduce deformation thereof during actuation, but to avoid the bulging effect, as shown in FIGS. 12-15.

In particular, FIGS. 12-15 show simulations made by the Applicant for the membrane 113 of FIGS. 10 and 11, by applying an actuation voltage of 40 V to the actuator 114 (between electrodes similar to the electrodes 16, 17 of FIG. 3).

Figure 12:
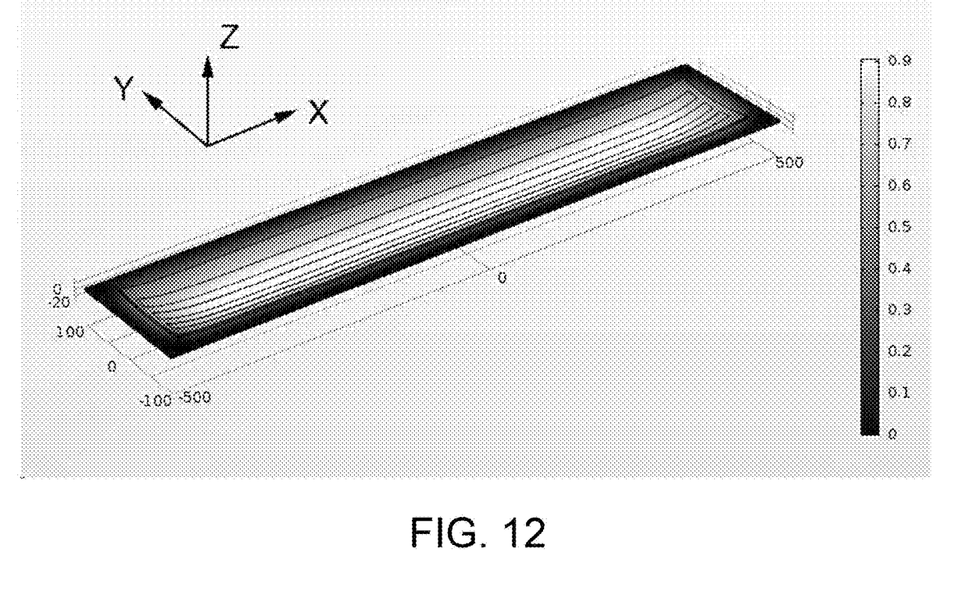
FIG. 12 shows, in grey scale and perspective, the displacement of the membrane portion of FIG. 11 in a uniform scale.
Figure 13:
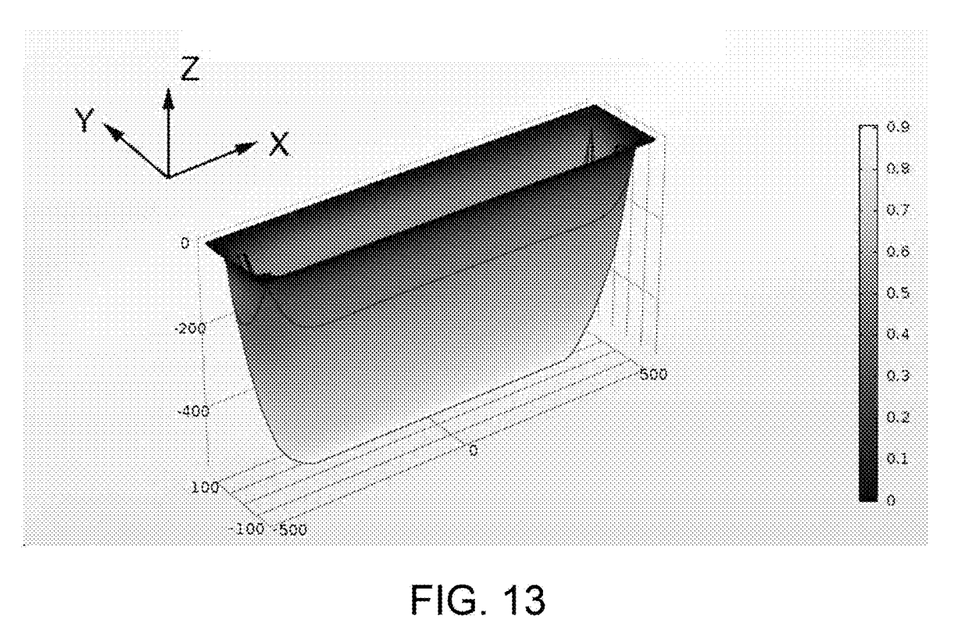
FIG. 13 shows, in grey scale and perspective, the displacement of the membrane portion of FIG. 11 in a vertically amplified scale.

In particular, FIG. 12 shows, in a grey scale and perspective, the displacement of the membrane 113 in an enlarged, uniform scale and FIG. 13 shows, also in a grey scale and perspective, the same displacement using an amplified scale along third axis Z to more clearly show the deformation.

Figure 14:
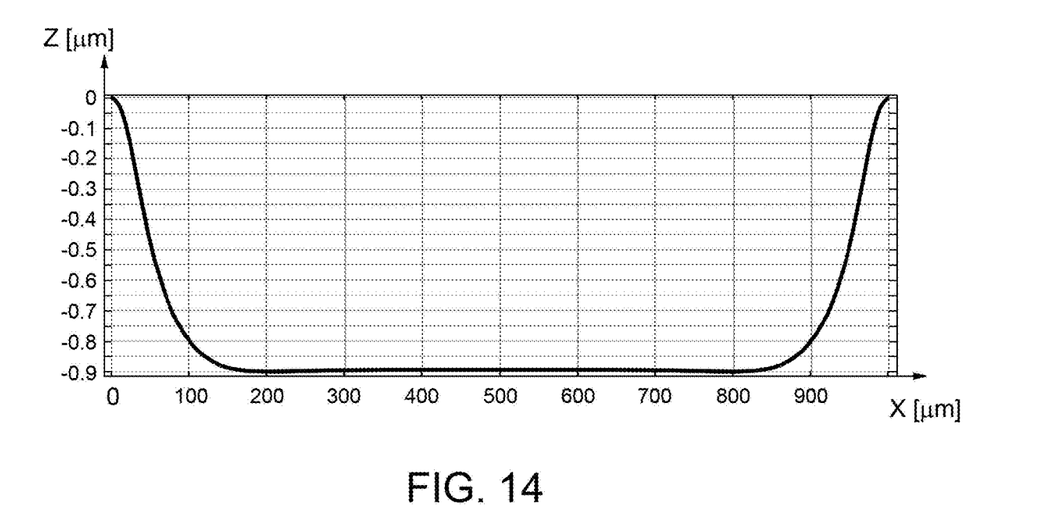
FIGS. 14 and 15 show plots of the displacement of the membrane portion in cross-sections of FIG. 11, taken along planes XIV-XIV and XV-XV, respectively.
Figure 15:
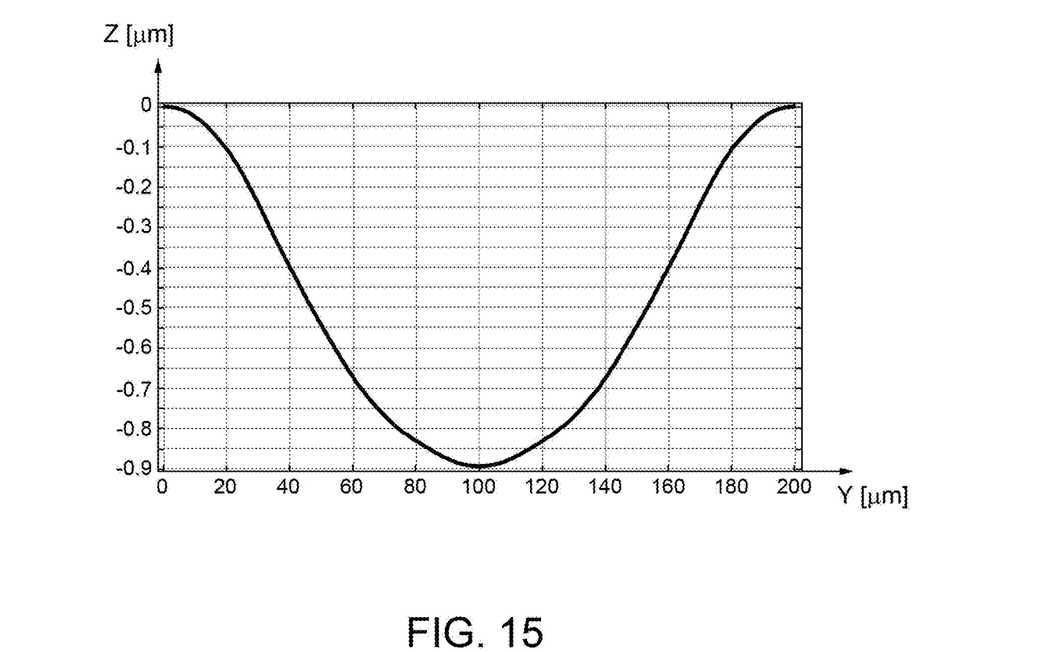

FIGS. 14 and 15 show the plots of the displacement of the membrane 113 (considered bidimensional, in view of the reduced thickness thereof) along a longitudinal and, respectively, transverse central direction thereof, parallel to first axis X and second axis Y of the Cartesian reference system, XYZ.

As may be seen, the membrane 113, when actuated, deforms uniformly both in the transverse direction (parallel to the second axis Y, FIG. 15), and in the longitudinal direction parallel to the first axis X (FIG. 14). In particular, FIGS. 13 and 15 show that the membrane 113 of the microfluidic device 101 has no bulging portions at the longitudinal ends.

In practice, the actuator 153 has a membrane 113 that is stiffened in the longitudinal direction by virtue of the passivation layer 114 (thus eliminating the bulged portions), but does not change its deformability in the transverse direction, by virtue of the longitudinal holes 170.

Uniform deformation in the longitudinal and in the transverse direction by virtue of the passivation layer 144 is achieved without negatively affecting the actuation action performed by the membrane 113. In fact, the simulations of the Applicant have shown that the deformed membrane 113 of FIGS. 10 and 11 have the same ability of displacing fluids and thus are able to displace the same volume of liquid (e.g., ink) as the deformed membrane 13 of the prior art injection cell 2.

The passivation layer 144 with the holes 170 may be manufactured by depositing the passivation layer 144 using techniques known in the manufacture of semiconductor chips and opening the holes 144 using a photolithographic process, as known in the manufacture of MEMS.

Figure 16:
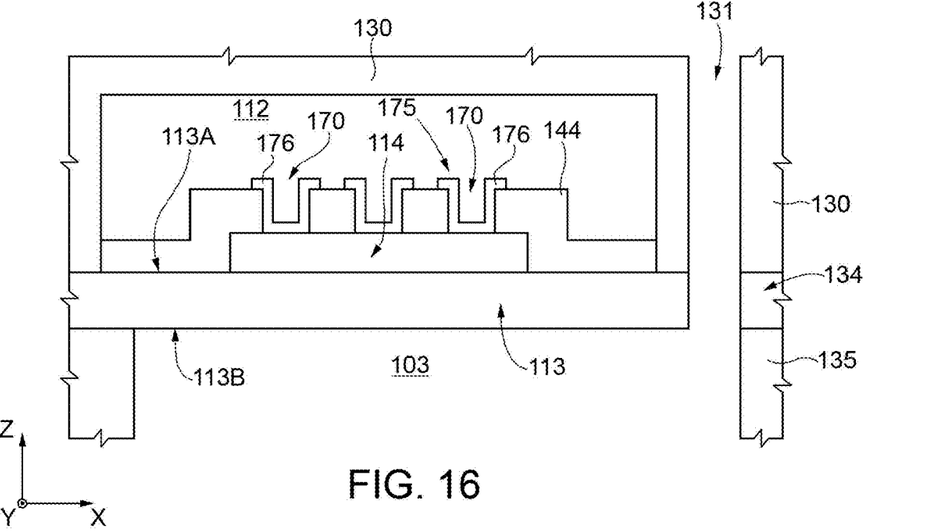
FIG. 16 is a schematic transverse cross-section of a detail of a different embodiment of the ejection cell.

FIG. 16 shows a different embodiment of the microfluidic device 101.

Here, the walls and the bottom of the holes 170 are covered by a sealing structure 175. For example, the sealing structure 175 is formed by covering regions 176 of gold material, made as gold bumps. Alternative materials may be platinum based metals, that have good chemical resistance to moisture and other etchants. The covering regions 176 seal the exposed portions of the actuator 114, in particular the piezoelectric layer thereof (the piezoelectric layer 18 in FIG. 3).

Thereby, the microfluidic device 101 of FIG. 16 is sealed against any moisture seeping in the actuator chamber 112.

Figure 17:
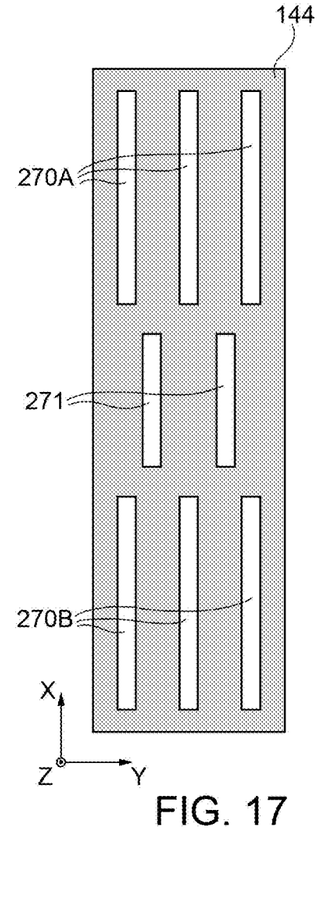
FIGS. 17-19 are plan views of the membrane portion according to different embodiments of the ejection cell.
Figure 18:
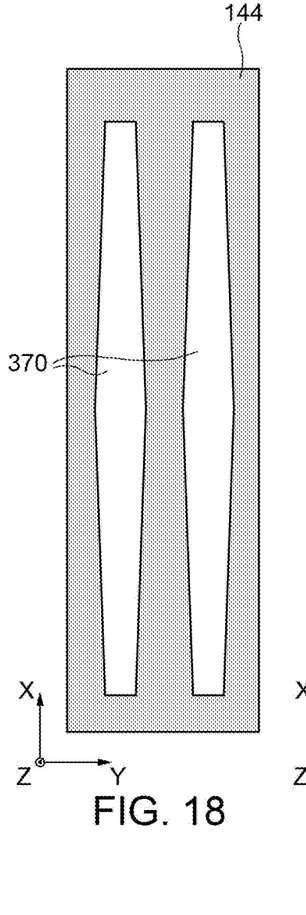
Figure 19:
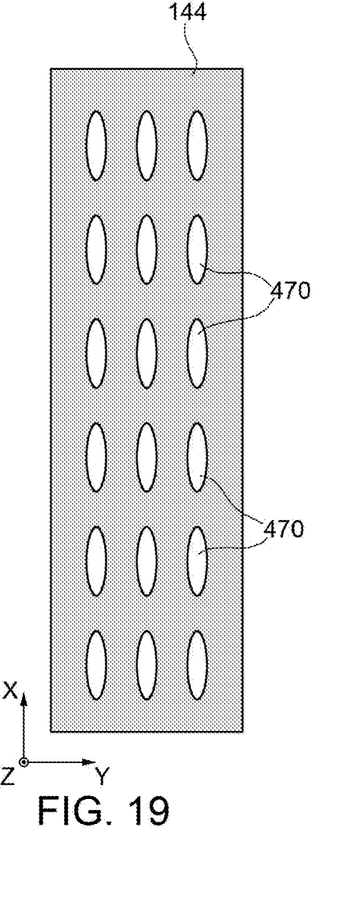

FIGS. 17-19 show embodiments of the microfluidic device 101 having holes with different shapes.

For example, FIG. 17 shows an embodiment where the holes, also in form of slits, indicated by 270A, 270B and called first holes hereinafter, do not extend along the entire length of the membrane 113, but are interrupted and arranged to form a first group of first holes 270A and a second group of first holes 270B, wherein two or more first holes 270A of the first group are aligned in the length direction (parallel to first axis Y of the Cartesian axis) and at a distance from corresponding first holes 270B in the second group. In addition, the passivation layer 144 may have further holes 271 in form of slits, extending in the length direction of the membrane 113, and offset with respect to the first holes 270A, 270B. In the embodiment of FIG. 17, the further holes 271 are arranged between the first group of first holes 270A and the second group of first holes 270B, the first group of first holes 270A extending from a first end of the membrane 113 and the second group of first holes 270B extending from a second end of the membrane 113.

FIG. 18 shows an embodiment of a passivation layer 144 wherein the holes, also in form of slits and indicated by 370, have not a rectangular area, but have a larger width at the center than at their ends (rhomboidal or elongated hexagonal shape). In the shown embodiment of FIG. 18, two holes 370 extend adjacent to each other for almost the entire length of the passivation layer 144. In a not shown alternative, the rhomboidal or elongated hexagonal holes 370 may extend along only a portion of the length of the passivation layer 144, with an arrangement similar to the one discussed above for holes 270 and, in case 271, of FIG. 17.

FIG. 19 shows an embodiment where the holes (indicated by 470) are oval, with their greater dimension (length) parallel to the longitudinal direction of the membrane 113 and the passivation 144. The holes 470 of FIG. 19 have a length that is much smaller than the length of the passivation layer 144 and are arranged regularly on a grid. In this case, they are aligned both in the longitudinal and in the transverse direction of the membrane 113 and of the passivation layer 144 (parallel to the first and the second axes X, Y of the Cartesian system XYZ).

In a different embodiment, not shown, the oval holes 470 may be arranged offset in the longitudinal direction and/or offset in the transverse direction; however, to ensure the desired rigidity in the longitudinal direction and to maintain the desired yielding in the transverse direction, their length extends in the longitudinal direction of the membrane 113 and of the passivation 144.

Also the holes 270, 271, 370 and 470 of FIGS. 17-19 may be coated by sealing regions such as the covering regions 176 of FIG. 16.

Figure 20:
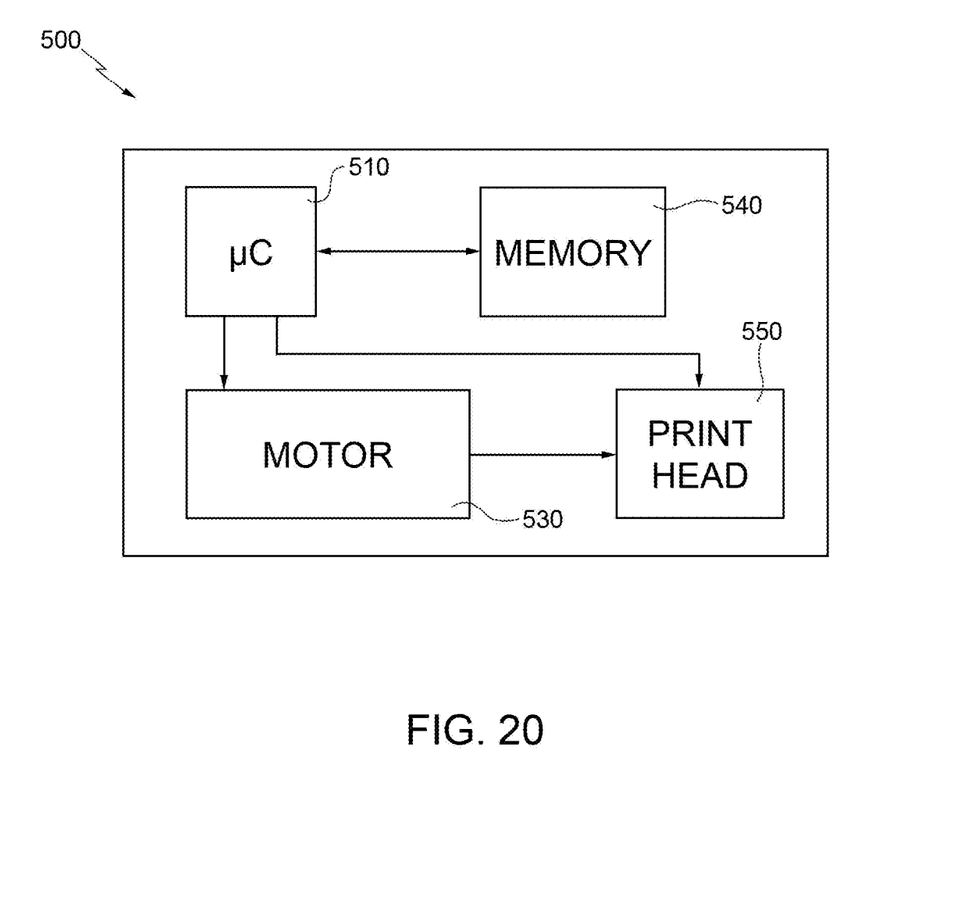
FIG. 20 is block scheme of a printhead comprising the microfluidic device of FIGS. 10-14.

The microfluidic device 101 of FIGS. 10-19 may be encompassed in a printing apparatus such as shown in FIG. 20.

In detail, FIG. 20 shows a printing apparatus 500 comprising a microprocessor 510, a memory 540 communicatively coupled to the microprocessor 510, a printhead 550 and a motor 530 to actuate the printhead 550. The printhead 550 may be the microfluidic device 101 of FIGS. 10-19. The microprocessor 310 is coupled to the printhead 550 and to the motor 530, and is configured to coordinate the movement of the printhead 550 (driven by the motor 530) and cause the ejection of liquid (for example, ink) from the printhead 550. Liquid ejection is performed by controlling the operation of the actuator 114 of each ejection cell 102.

Finally, it is clear that numerous variations and modifications may be made to the microfluidic device described and illustrated herein, all falling within the scope of the disclosure.

For example, the various embodiments described above can be combined to provide further embodiments. The material of the passivation layer may be of a material different from nitride, such as silicon-oxide-nitride. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microfluidic MEMS device comprising:
   an ejection cell having:
      a fluid chamber;
      an actuator chamber;
      a membrane having a first surface facing the actuator chamber and a second surface facing the fluid chamber, the membrane having an elongated area defining a longitudinal direction and a transverse direction;
      a piezoelectric actuator on the first surface of the membrane; and
      a passivation layer on the piezoelectric actuator, wherein the passivation layer has a plurality of through holes extending to a surface of the piezoelectric actuator.

2. The microfluidic MEMS device according to claim 1, wherein the plurality of through holes expose the surface of the piezoelectric actuator to the actuator chamber.

3. The microfluidic MEMS device according to claim 1, wherein the plurality of through holes in a plan view have an elongated shape with a greater dimension and a smaller dimension, the greater dimension of the plurality of through holes being parallel to the longitudinal direction of the membrane.

4. The microfluidic MEMS device according to claim 3, wherein the plurality of through holes have a shape, in plan view, selected between rectangular, oval, rhomboidal, elongated hexagonal and elongated polygonal shape.

5. The microfluidic MEMS device according to according to claim 1, wherein the plurality of through holes are arranged in groups that extend adjacent to each other in the transverse direction along the membrane.

6. The microfluidic MEMS device according to claim 1, wherein the plurality of through holes, comprise at least a first group of through holes and a second group of through holes, wherein at least one of the through holes of the first group of through holes is longitudinally aligned to at least one of the holes of the second group of through holes.

7. The microfluidic MEMS device according to claim 1, wherein at least some of the plurality of through holes extend offset from other through holes of the plurality of through holes in the longitudinal direction of the membrane.

8. The microfluidic MEMS device according to claim 1, wherein the passivation layer is of a material selected among silicon nitride and silicon-oxide-nitride.

9. The microfluidic MEMS device according to claim 1, comprising a sealing structure covering the plurality of through holes.

10. The microfluidic MEMS device according to claim 9, wherein the plurality of through holes have side walls and a bottom, and wherein the sealing structure comprises sealing regions extending on the side walls and on the bottom of the plurality of through holes.

11. The microfluidic MEMS device according to claim 10, wherein the sealing regions are of a material selected among gold and platinum based metals.

12. A printhead comprising:
    a microprocessor; and
    a microfluidic MEMS device coupled to the microprocessor, the microfluidic MEMS device including an ejection cell comprising:
       a fluid chamber;
       an actuator chamber;
       a membrane having a first surface facing the actuator chamber and a second surface facing the fluid chamber, the membrane having an elongated area defining a longitudinal direction and a transverse direction;
       a piezoelectric actuator on the first surface of the membrane; and
       a passivation layer on the piezoelectric actuator, wherein the passivation layer has a plurality of through holes, the plurality of through holes having greater dimensions extending in a same direction as the longitudinal direction of the membrane.

13. The printhead according to claim 12, wherein the plurality of through holes of the passivation layer includes first and second through holes that are arranged side by side along the transverse direction of the membrane.

14. The printhead according to claim 12, wherein the passivation layer of the microfluidic MEMS device is of a material selected among silicon nitride and silicon-oxide-nitride.

15. The printhead according to claim 12, wherein the microfluidic MEMS device further comprises a sealing structure that covers sidewalls of the plurality of through holes and a surface of the piezoelectric actuator that is exposed by the plurality of through holes.

16. The printhead according to claim 15, wherein the sealing structure is a metal material.

17. A microfluidic MEMS device comprising:
    a fluid chamber;
    an actuator chamber;
    a membrane having a first surface facing the actuator chamber and a second surface facing the fluid chamber, the membrane having an elongated area defining a longitudinal direction and a transverse direction;

a piezoelectric actuator coupled to the first surface of the membrane, the piezoelectric actuator configured to cause, when in use, the membrane to deflect, the piezoelectric actuator having a longitudinal length; and a passivation layer on a surface of the piezoelectric actuator, the passivation layer including a plurality of through holes, wherein the plurality of through holes have a greatest dimension that extends in a same direction as the longitudinal length of the piezoelectric actuator.

18. The microfluidic MEMS device according to claim 17, wherein the plurality of through holes expose the surface of the piezoelectric actuator.

19. The microfluidic MEMS device according to claim 17, further comprising a sealing structure that covers sidewalls of the plurality of through holes and a surface of the piezoelectric actuator that is exposed by the plurality of through holes.

20. The microfluidic MEMS device according to claim 17, wherein the plurality of through holes are arranged in groups, each group including a set of through holes arranged side by side.

* * * * *